United States Patent [19]

Yoshimura

[11] 4,024,568

[45] May 17, 1977

[54] TRANSISTOR WITH BASE/EMITTER ENCIRCLEMENT CONFIGURATION

[75] Inventor: Masayoshi Yoshimura, Tokyo, Japan

[73] Assignee: Hitachi, Ltd., Japan

[22] Filed: Sept. 29, 1975

[21] Appl. No.: 617,809

[30] Foreign Application Priority Data

Sept. 27, 1974  Japan .......................... 49-110530

[52] U.S. Cl. ................................. 357/68; 357/36; 357/45; 357/54; 357/71

[51] Int. Cl.$^2$ ................. H01L 23/48; H01L 29/72; H01L 27/10; H01L 29/34

[58] Field of Search ................. 357/36, 45, 68, 54, 357/71

[56] References Cited

UNITED STATES PATENTS

| | | | |
|---|---|---|---|
| 3,582,726 | 6/1971 | Gilbert | 357/36 |
| 3,593,068 | 7/1971 | Rosier | 357/36 |
| 3,922,706 | 11/1975 | Kaiser | 357/36 |

FOREIGN PATENTS OR APPLICATIONS 935,710  9/1963  United Kingdom ................ 357/38

*Primary Examiner*—Edward J. Wojciechowicz
*Attorney, Agent, or Firm*—Craig & Antonelli

[57] ABSTRACT

In a transistor wherein a second conductivity type region is formed surrounding a first conductivity type region in a principal surface electrodes are formed on a surface of the first conductivity type region, an electrode of the second conductivity type region is formed in a manner to encircle the first-mentioned electrodes, and electrodes of the first conductivity type region are led outside the electrode of the second conductivity type region through an insulating film, whereby concentration of current is prevented.

4 Claims, 2 Drawing Figures

TRANSISTOR WITH BASE/EMITTER ENCIRCLEMENT CONFIGURATION

FIELD OF THE INVENTION

This invention relates to a semiconductor device particularly an improved transistor.

BACKGROUND OF THE INVENTION

In order to obtain a transistor having a high emitter current density and a high-frequency transistor, it is well known that the ratio of the emitter region spreading area to the emitter region area should be made as great as possible.

As such a transistor, there is one in which the emitter region is constructed in the form of a net and a base region makes inroads into the meshes of the net of the emitter region as disclosed in Japanese Pat. No. 24384/1969.

In such a construction, the ratio of the emitter region spreading area to the emitter region area certainly increases, and hence, a larger amount of current than in the prior art flows from the emitter region to the base region. In this case, however, the concentration of current often arises in the interval in which the current flows from an emitter electrode to a base electrode. For this reason, a transistor of high emitter current density and a high-frequency transistor which are satisfactory cannot be produced by merely increasing the ratio of the emitter region spreading area to the emitter region area. The inventor has taken note of this fact, and has made the present invention.

BRIEF SUMMARY OF THE INVENTION

It is, therefore, an object of this invention to provide a transistor which is free from the disadvantages stated above and which provides a transistor of high emitter current density and a high-frequency transistor.

BRIEF DESCRIPTION OF THE INVENTION

The fundamental construction of the present invention for accomplishing the above object consists in a semiconductor device especially a transistor, wherein a second conductivity type region is formed surrounding a first conductivity type region in a principal surface of the device, characterized in that electrodes are formed on a surface of said first conductivity type region, that an electrode of said second conductivity type region is formed in a manner to encircle the first-mentioned electrodes, and that said electrodes of the first conductivity type region are led outside the electrode of the second conductivity type region through an insulating film.

DETAILED DESCRIPTION

Figure 1:
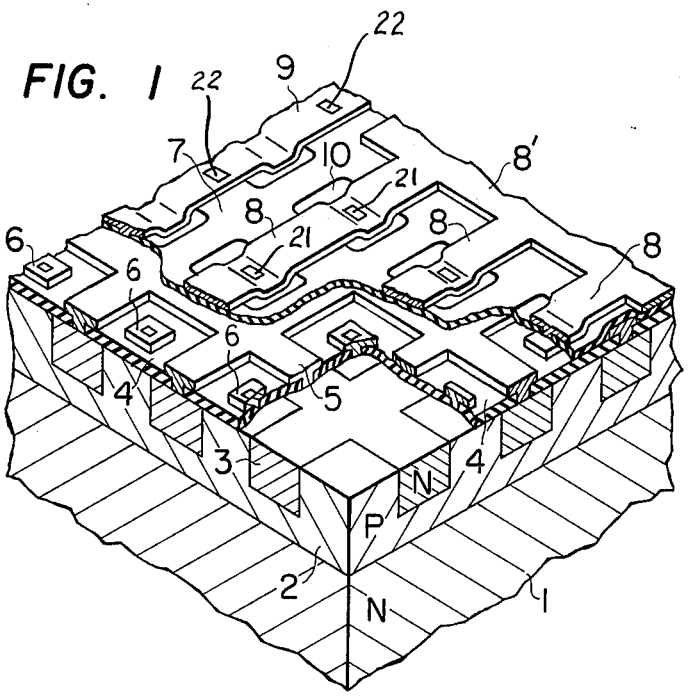
FIG. 1 is a constructional view showing an embodiment of the transistor according to the invention.

Referring to FIG. 1, a P-type semiconductor layer 2 is formed on an N-type semiconductor substrate 1 by, for example, epitaxial vapor growth. In the surface of the P-type semiconductor layer 2, an N-type diffused layer 3 is formed in the shape of a net or grid. Here, the N-type semiconductor substrate 1 is a collector layer, the P-type semiconductor layer 2 is a base layer, and the Ntype diffused layer 3 is an emitter layer. On the P-type semiconductor layer 2 and the N-type diffused layer 3 thus formed, there is a thermal oxidation film which is formed during diffusion or a newly formed oxide film 4 formed by, e.g., the CVD (chemical vapor deposition) process after removing the thermal oxidation film. The film chiefly protects the junction portion between the P-type semiconductor layer 2 and the N-type diffused layer 3. On the oxide film 4, an emitter electrode 5 is formed by evaporating a metal layer, such as aluminum, along the N-type diffused layer or emitter layer 3 formed into the shape of a net or grid. In this case, the emitter electrode 5 formed into the shape of a net along the emitter layer is electrically connected with the N-type diffused layer 3 through slots in the oxide film 4 as provided previous to the formation of the electrode.

In areas corresponding to the meshes of the emitter electrode 5 formed into the shape of a net or grid, base electrodes 6 which are electrically connected with pockets of the P-type semiconductor layer 2 through holes provided in the oxide film 4 are formed by evaporation of a metal such as aluminum. On the emitter electrode 5 as well as the base electrodes 6 and on areas of the oxide film 4 other than the electrodes, an oxide film 7 is formed by e.g., the CVD process. The oxide film 7 is provided with apertures 21 at parts lying on the base electrodes 6. Along areas coupling these apertures in straight lines, long and narrow base electrodes 8 are formed over the oxide film 7 by evaporation of a metal such as aluminum. The plurality of long and narrow base electrodes 8 are joined to a pad of comparatively large area 8'. At an area other than the area of the base electrodes 8 and the pad 8', a pad of comparatively large area 9 exists which is formed also by evaporation of aluminum. The pad 9 is electrically connected with the emitter electrode 5 due to the apertures 22 provided in the underlying oxide film 7.

In this way, the electrodes are formed entirely on the emitter region and the base region. As a consequence, electrons injected from the emitter electrode can uniformly flow to all the base electrodes encircled by the emitter electrode. Accordingly, the prior art flow of electrons concentratively to the base electrodes from the emitter electrode partially formed is avoided, and hence, the amount of the flow of electrons becomes large. A transistor of high emitter current density and a high-frequency transistor can therefore be obtained.

In the present embodiment, the transistor in which the emitter region is constructed in the form of a net and in which the base region is formed into the meshes of the net of the emitter region has been mentioned as an example. Of course, this invention is not restricted thereto, but is applicable to general transistors.

Figure 2:
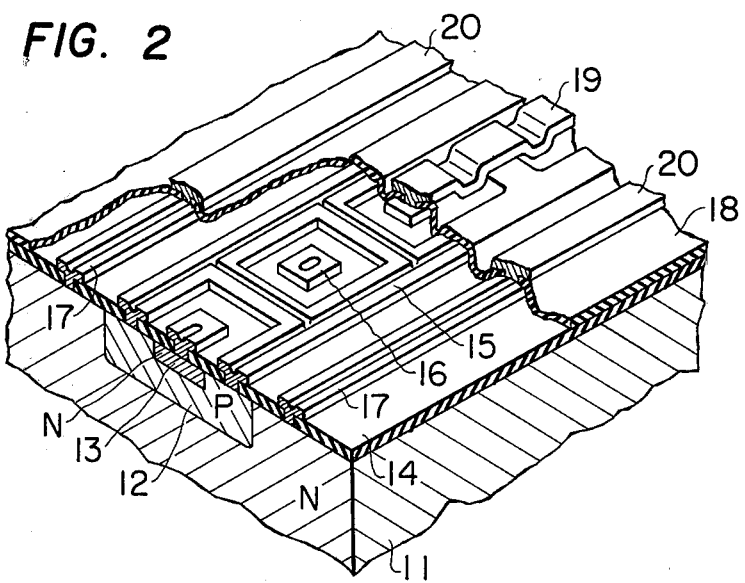
FIG. 2 is a constructional view showing another embodiment of the transistor according to the invention.

By way of example, in an embodiment shown in Figure 2, an oblong P-type diffused layer 12 is formed in an N-type semiconductor substrate 11, and a plurality of N-type diffused layers 13 are formed within the P-type diffused layer 12 in the longitudinal direction thereof. An oxide film 14 is formed on the entire area of the surface of the N-type semiconductor substrate 11, the surface of the P-type diffused layer 12 and the surface of the N-type diffused layer 13, and it protects the junction portions between the respective layers. At an area on the oxide film 14 and over the oblong P-type diffused layer 12, a ladder-shaped base electrode 15 is formed by, e.g., evaporation of aluminum. The base electrode 15 is electrically connected with the P-type diffused layer 12 through slots provided in the underlying oxide film 14. Within the frames of the base electrode 15 which is formed in the shape of the ladder, a plurality of emitter electrodes 16 are formed by, e.g., evaporation of aluminum. Further, in parallel with the ladder-shaped base electrode 15 and on both sides thereof, collector electrodes 17 are formed similarly by, e.g., evaporation of aluminum. Herein, it is natural that the oxide film 14 under the emitter electrodes 16 as well as the collector electrodes 17 are provided with holes and that the emitter electrodes 16 and the collector electrodes 17 are electrically connected with the N-type diffused layer 13 and the N-type semiconductor substrate 11 through the holes, respectively. A further new oxide film 18 is formed on the base electrode 15, emitter electrodes 16 and collector electrodes 17 thus formed and on the oxide film 14. Apertures are provided at those areas of the oxide film 18 which overlie the emitter electrodes 16, and an emitter electrode 19 is formed on the oxide film 18 in a manner to couple the apertures. On the other hand, the oxide film 18 is also formed with slots at its areas overlying the collector electrodes 17, and collector electrodes 20 are formed along the slots. Although not shown in the figure, a base electrode is formed at an area on the oxide film 18, and it is electrically connected with the base electrode 15 underlying the oxide film 18 through a hole formed in the oxide film 18.

Although two embodiments of transistors have been described, this invention is also applicable to semiconductor devices such as diodes.

As is apparent from the above explanation, in accordance with the semiconductor device of this invention, the construction is such that the electrodes can be formed entirely on the emitter region and on the base region. Hence, the electrons injected into the first conductivity type region can flow uniformly to all the electrodes on the second conductivity type region surrounding the first conductivity type region. Accordingly, it never occurs that, as in the prior art, the electrons injected into the first conductivity type region flow concentratively to the electrodes formed at the partial areas, and the amount of the flow of electrons becomes large. The transistor of high emitter current density and the high-frequency transistor can consequently be acquired.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A transistor comprising:
    a base region of a first conductivity type having an oblong shape and formed in a major surface of a collector region of a second conductivity type, wth a plurality of separated emitter regions of the second conductivity type being formed along a line in said base region;
    a first layer of insulating material selectively disposed on the major surface of said emitter, base, and collector regions so as to selectively expose prescribed portions thereof;
    first emitter electrodes formed on each emitter region;
    a first ladder-shaped base electrode having long side portions and interconnecting rung portions formed on said base region so as to completely surround said emitter regions;
    first collector electrodes formed on said collector region in parallel to the long side portions of said base electrode at both sides thereof;
    a second layer of insulating material overlying said first layer of insulating material and said first emitter, base and collector electrodes and having apertures therethrough exposing said plurality of first emitter electrodes; and
    a second emitter electrode formed on said second layer of insulating material and contacting said first emitter electrodes through the apertures of said second layer of insulating material.

2. A transistor according to claim 1, wherein said second layer of insulating material has futher apertures therethrough expposing said first base and collector electrodes, and further comprising
    a second base and a collector electrode formed on said second layer and contacting said first base and collector electrodes through said apertures in said second layer insulating material.

3. A transistor comprising:
    a base region of a first conductivity type;
    an emitter region of a second conductivity type, opposite said first conductivity type, formed in a surface of said base region and having a configuration so as to define and surround a plurality of pockets of the semiconductor material of said base region;
    wherein said emitter region is in the shape of a net so that said pockets of the semiconductor material of the base region form the meshes of the net-shaped emitter region;
    a first layer of insulating material selectively disposed on the surface of said base and emitter regions so as to expose prescribed portions thereof;
    a plurality of first electrodes respectively formed on the exposed surfaces of said plurality of pockets of the semiconductor material of said base region;
    a second electrode formed on the exposed surface of said emitter region so as to surround said pockets of the semiconductor material of said base region, wherein said second electrode is in the shape of net,
    a second layer of insulating material overlying said first layer of insulating material and said first and second electrodes and having apertures therethrough exposing said plurality of first electrodes; and
    a third electrode contacting said first electrodes through the apertures of said second layer of insulaing material.

4. A transistor device according to claim 3, wherein said second layer of insulating material has at least one aperture therethrough exposing said second electrode, and further comprising a fourth electrode contacting said second electrode through said at least one aperture through said second layer of insulating material.

* * * * *